United States Patent
Park et al.

(10) Patent No.: US 7,510,931 B2
(45) Date of Patent: Mar. 31, 2009

(54) METHOD OF FABRICATING A NONVOLATILE MEMORY DEVICE

(75) Inventors: Ki-yeon Park, Seoul (KR); Han-mei Choi, Seoul (KR); Seung-hwan Lee, Suwon-si (KR); Sung-tae Kim, Seoul (KR); Young-sun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 94 days.

(21) Appl. No.: 11/605,452

(22) Filed: Nov. 29, 2006

(65) Prior Publication Data

US 2008/0096349 A1    Apr. 24, 2008

(30) Foreign Application Priority Data

Oct. 20, 2006    (KR) ...................... 10-2006-0102468

(51) Int. Cl.
H01L 21/336    (2006.01)
H01L 21/8238    (2006.01)
H01L 21/4763    (2006.01)

(52) U.S. Cl. ...................... 438/257; 438/201; 438/283; 438/287; 438/593; 438/761; 257/E21.423; 257/E21.679; 257/E21.209

(58) Field of Classification Search ................. 438/257, 438/201, 283, 287, 593–594, 761; 257/E21.423, 257/E21.679, E21.209
See application file for complete search history.

(56) References Cited

U.S. PATENT DOCUMENTS

| 6,586,349 | B1 * | 7/2003 | Jeon et al. ................... 438/785 |
| 7,172,938 | B2 * | 2/2007 | Choi et al. ................... 438/257 |
| 2003/0185981 | A1 | 10/2003 | Min et al. |
| 2004/0051134 | A1 | 3/2004 | Jang et al. |
| 2005/0181555 | A1 * | 8/2005 | Haukka et al. .............. 438/232 |
| 2005/0215006 | A1 * | 9/2005 | Horii et al. .................. 438/240 |
| 2006/0022252 | A1 * | 2/2006 | Doh et al. .................... 257/314 |
| 2006/0033152 | A1 | 2/2006 | Kim et al. |
| 2006/0081948 | A1 * | 4/2006 | Lim et al. .................... 257/410 |
| 2006/0091458 | A1 | 5/2006 | Kim et al. |
| 2007/0004154 | A1 * | 1/2007 | Hong et al. ................. 438/287 |
| 2007/0201276 | A1 * | 8/2007 | Ho et al. ................ 365/185.18 |

FOREIGN PATENT DOCUMENTS

| KR | 10-2003-0079181 | 10/2003 |
| KR | 10-2005-0067454 | 7/2005 |
| KR | 10-2006-0015373 A | 2/2006 |
| KR | 10-2006-0039733 A | 5/2006 |

* cited by examiner

*Primary Examiner*—Walter L Lindsay, Jr.
*Assistant Examiner*—Mohsen Ahmadi
(74) *Attorney, Agent, or Firm*—Lee & Morse, P.C.

(57) ABSTRACT

A method of fabricating a nonvolatile memory device includes forming a charge tunneling layer on a semiconductor substrate, forming a charge trapping layer on the charge tunneling layer, forming a first charge blocking layer on the charge trapping layer by supplying a metal source gas and a first oxidizing gas onto the charge trapping layer, forming a second charge blocking layer on the first charge blocking layer by supplying a metal source gas and a second oxidizing gas onto the first charge blocking layer, wherein the second oxidizing gas has a higher oxidizing power as compared to the first oxidizing gas, and forming a gate electrode layer on the second charge blocking layer.

16 Claims, 6 Drawing Sheets

METHOD OF FABRICATING A NONVOLATILE MEMORY DEVICE

BACKGROUND OF THE INVENTION

1. Field of the Invention

The present invention relates to a method of fabricating a nonvolatile memory device. In particular, the present invention relates to a method of fabricating a nonvolatile memory device having enhanced electrical characteristics.

2. Description of the Related Art

In general, nonvolatile memory devices, e.g., read only memory (ROM), refer to semiconductor devices that can retain data permanently, i.e., when the power supply is turned off. Accordingly, nonvolatile memory devices may be widely used in various fields.

Nonvolatile memory devices may be classified according to types of memory storage layers employed in a unit cell thereof, i.e., floating-gate type nonvolatile memory devices and charge-trapping type nonvolatile memory devices. Recently, development of charge-trapping type nonvolatile memory devices has increased due to their low power consumption and high integration capabilities.

The conventional charge-trapping type nonvolatile memory device may be classified as a silicon-oxide-nitride-oxide-silicon (SONOS) device or as a metal-oxide-nitride-oxide-silicon (MONOS) device. Further, the conventional charge-trapping type nonvolatile memory device may include charge tunneling layers, charge trapping layers for injecting and retaining electric charges, and charge blocking layers above the charge trapping layers. The charge blocking layers may be formed of metal oxide materials at a reduced thickness to improve high density integration and reduce leakage current thereof.

However, formation of metal oxide layers may require large amounts of ozone ($O_3$), thereby triggering potential oxidation of layers that are in communication therewith, e.g., the charge trapping layers. Consequently, oxide layers may be formed on interfaces between the charge trapping layers and the charge blocking layers, thereby deteriorating threshold voltage window ($V_{th}$ window) characteristics of the nonvolatile memory device.

Accordingly, there exists a need for an improved method of forming a nonvolatile memory device having a metal oxide charge blocking layer exhibiting enhanced threshold voltage window characteristics.

SUMMARY OF THE INVENTION

The present invention is therefore directed to a method of fabricating a nonvolatile memory device, which substantially overcomes one or more of the problems due to the limitations and disadvantages of the related art.

It is therefore a feature of an embodiment of the present invention to provide a method of fabricating a nonvolatile memory device having a metal oxide charge blocking layer exhibiting enhanced threshold voltage window characteristics.

At least one of the above and other features of the present invention may be realized by providing a method of fabricating a nonvolatile memory device, including forming a charge tunneling layer on a semiconductor substrate, forming a charge trapping layer on the charge tunneling layer, forming a first charge blocking layer on the charge trapping layer by supplying a metal source gas and a first oxidizing gas onto the charge trapping layer, forming a second charge blocking layer on the first charge blocking layer by supplying a metal source gas and a second oxidizing gas onto the first charge blocking layer, wherein the second oxidizing gas has a higher oxidizing power as compared to the first oxidizing gas, and forming a gate electrode layer on the second charge blocking layer.

Supplying the first oxidizing gas may include supplying any one of water vapor ($H_2O$), hydrogen peroxide ($H_2O_2$), nitrogen dioxide ($NO_2$), nitrous oxide ($N_2O$), oxygen ($O_2$), and so forth. Additionally, supplying the second oxidizing gas may include supplying ozone ($O_3$). Forming each of the first and second charge blocking layers may include depositing a layer of aluminum oxide ($Al_2O_3$), hafnium oxide ($HfO_2$), zirconium oxide ($ZrO_2$), lanthanum oxide ($La_2O_3$), tantalum oxide ($Ta_2O_3$), titanium oxide ($TiO_2$), strontium titanium oxide ($SrTiO_3$), barium strontium titanium oxide (BST), or a combination thereof. Further, forming the first and second charge blocking layers may include use of identical materials.

Forming the first charge blocking layer and the second charge blocking layer may include repeating the supplying of the metal source gas and the first and second oxidizing gases, respectively, until a predetermined total thickness of the first and second charge blocking layers may be formed. Repeating the supplying of the metal source gas and the first and second oxidizing gases may include depositing the first and second charge blocking layers to have a predetermined total thickness of from about 100 angstroms to about 200 angstroms.

Repeating the supplying of the metal source gas and the first and second oxidizing gases may include forming the first charge blocking layer to have a lower thickness than the second charge blocking layer. More specifically, forming the first charge blocking layer may include forming a layer having a thickness of from about 5 angstroms to about 50 angstroms. Forming the second charge blocking layer may include forming a layer having a thickness of from about 50 angstroms to about 195 angstroms.

Supplying the metal source gas may include supplying an aluminum source gas. Further, supplying the aluminum source gas may include supplying any one of trimethyl-aluminum (TMA: $Al(CH_3)_3$), aluminum chloride ($AlCl_3$), trimethylamine alane ($AlH_3N(CH_3)_3$), trimethyl-aluminum oxetane ($C_6H_{15}AlO$), dibutyl-aluminum hydride ($((C_4H_9)_2AlH)$), dimethyl-aluminum chloride ($((CH_3)_2AlCl)$), triethyl-aluminum ($((C_2H_5)_3Al)$) or tributyl-aluminum ($((C_4H_9)_3Al)$).

Forming the charge tunneling layer may include depositing silicon oxide ($SiO_2$), silicon-oxynitride (SiON), silicon nitride ($Si_3N_4$), germanium-oxynitride ($Ge_xO_yN_z$), germanium silicon oxide ($Ge_xSi_yO_z$), a high-k dielectric material, or a combination thereof on the semiconductor substrate. Forming the charge trapping layer may include depositing silicon-oxynitride (SiON), silicon nitride ($Si_3N_4$), or metal oxynitride on the charge tunneling layer. Forming the gate electrode layer may include depositing polysilicon, a metallic material, metal nitride, conductive metal oxide, or a combination thereof onto the charge blocking layer.

The method may further include purging an unreacted gas after every supplying of the metal source gas, the first oxidizing gas, or the second oxidizing gas. Purging the unreacted gas may include supplying an inert gas.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0102468 filed on Oct. 20, 2006 in the Korean Intellectual Property Office, and entitled: "Method of Fabricating Nonvolatile Memory Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will further be understood that when an element is referred to as being "on" another element, layer or substrate, it can be directly on the other element, layer or substrate, or intervening elements or layers may also be present. Further, it will be understood that when an element or layer is referred to as being "under" another element or layer, it can be directly under, or one or more intervening elements or layers may also be present. In addition, it will also be understood that when an element or layer is referred to as being "between" two elements or layers, it can be the only element or layers between respective two elements or layers, or one or more intervening elements or layers may also be present. Like reference numerals refer to like elements or layers throughout.

Figure 1:
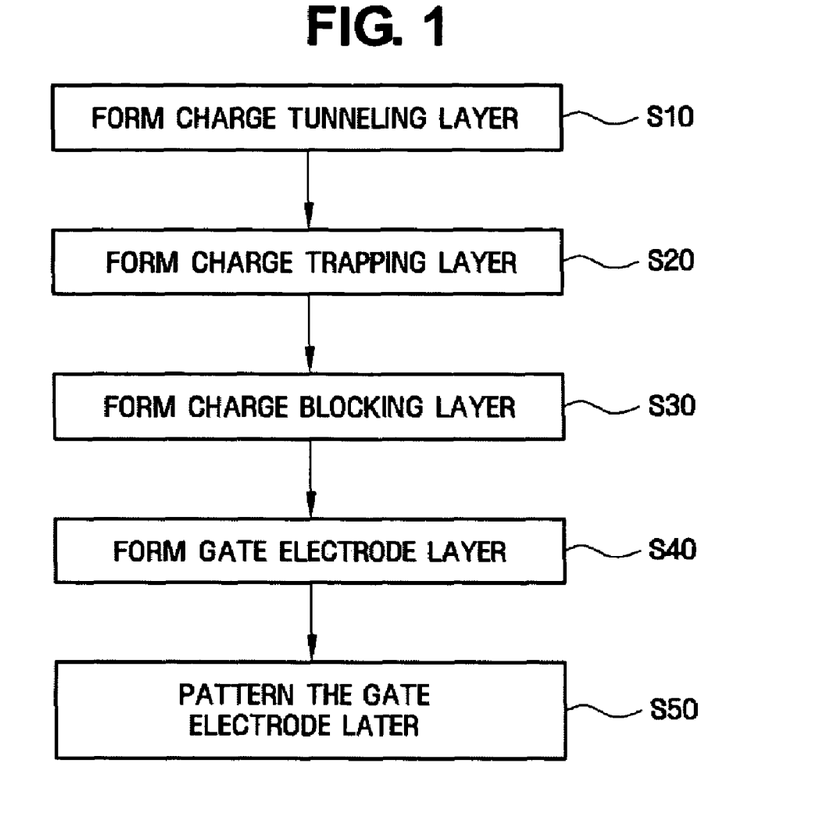
FIG. 1 illustrates a flowchart of a method of fabricating a nonvolatile memory device according to an embodiment of the present invention.
Figure 2A:
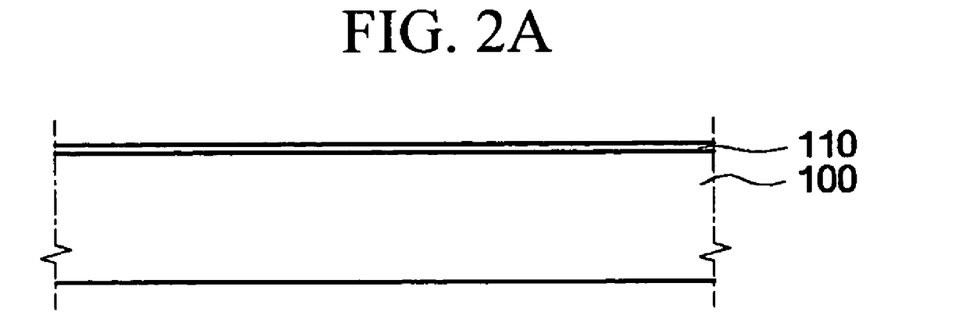
FIGS. 2A-2E illustrate cross-sectional views of sequential stages during fabrication of a nonvolatile memory device according to an embodiment of the present invention.
Figure 2B:
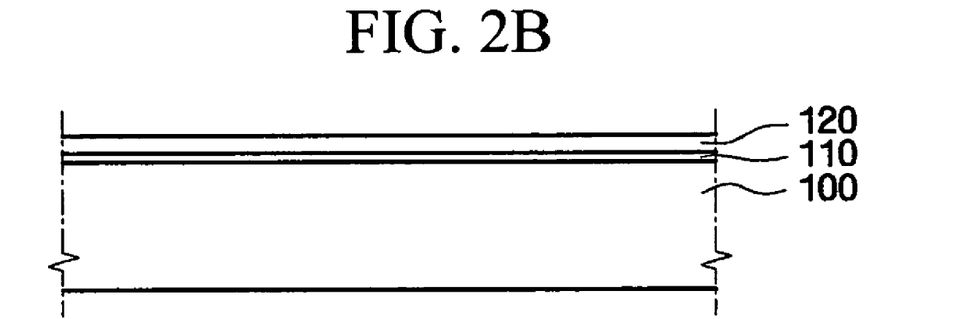
Figure 2C:
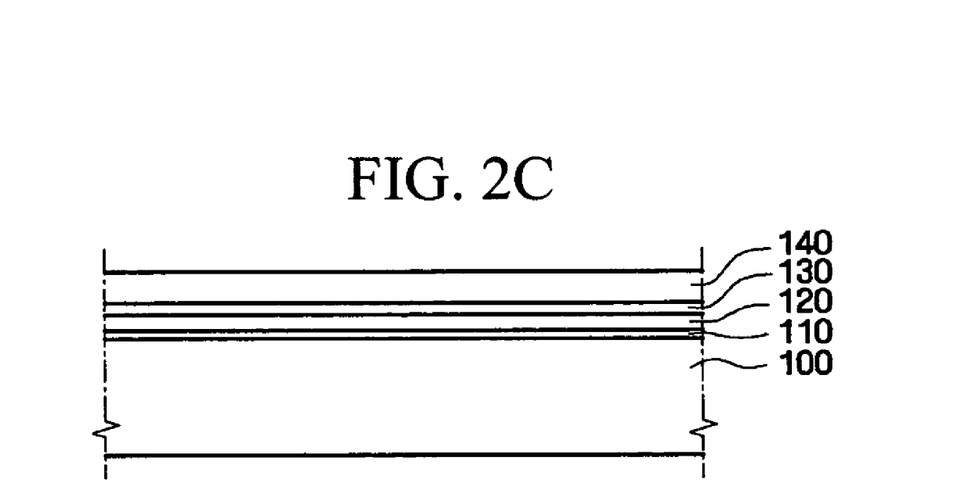
Figure 2D:
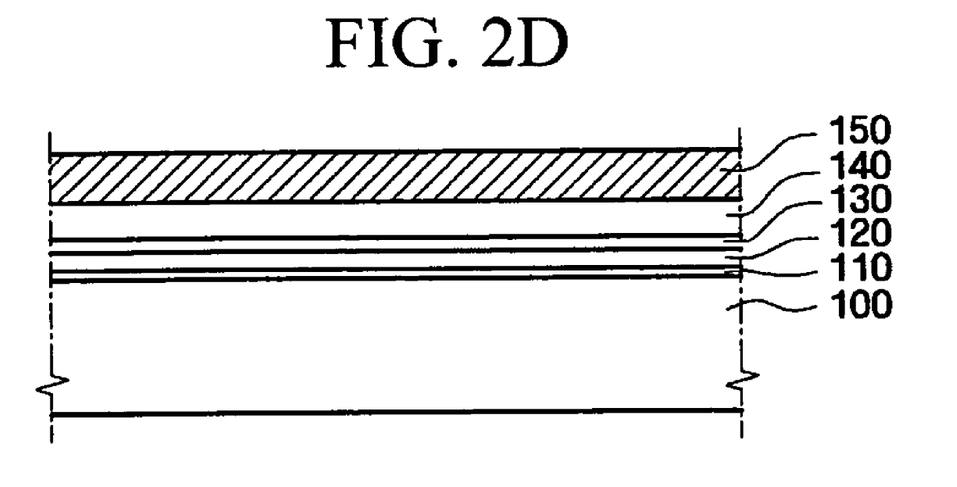
Figure 2E:
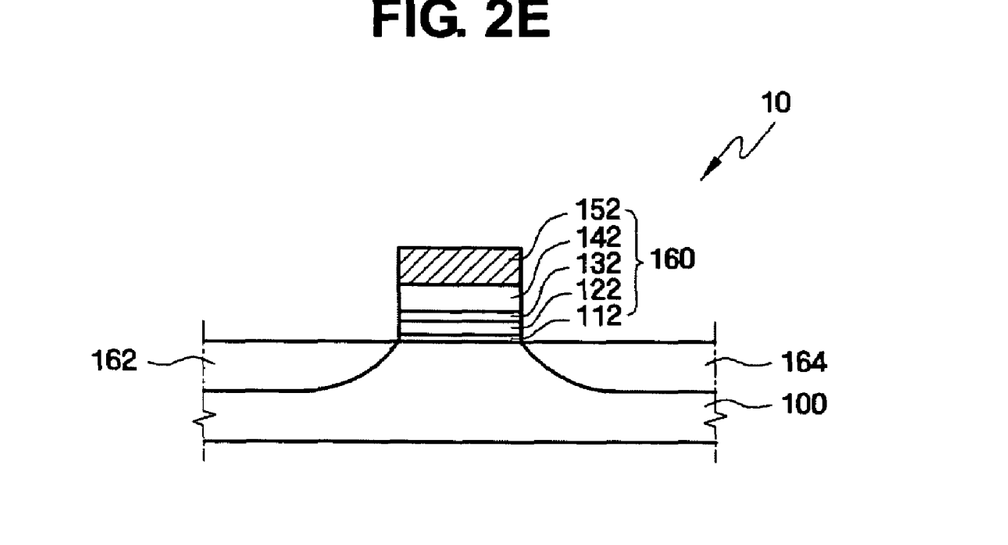
Figure 3:
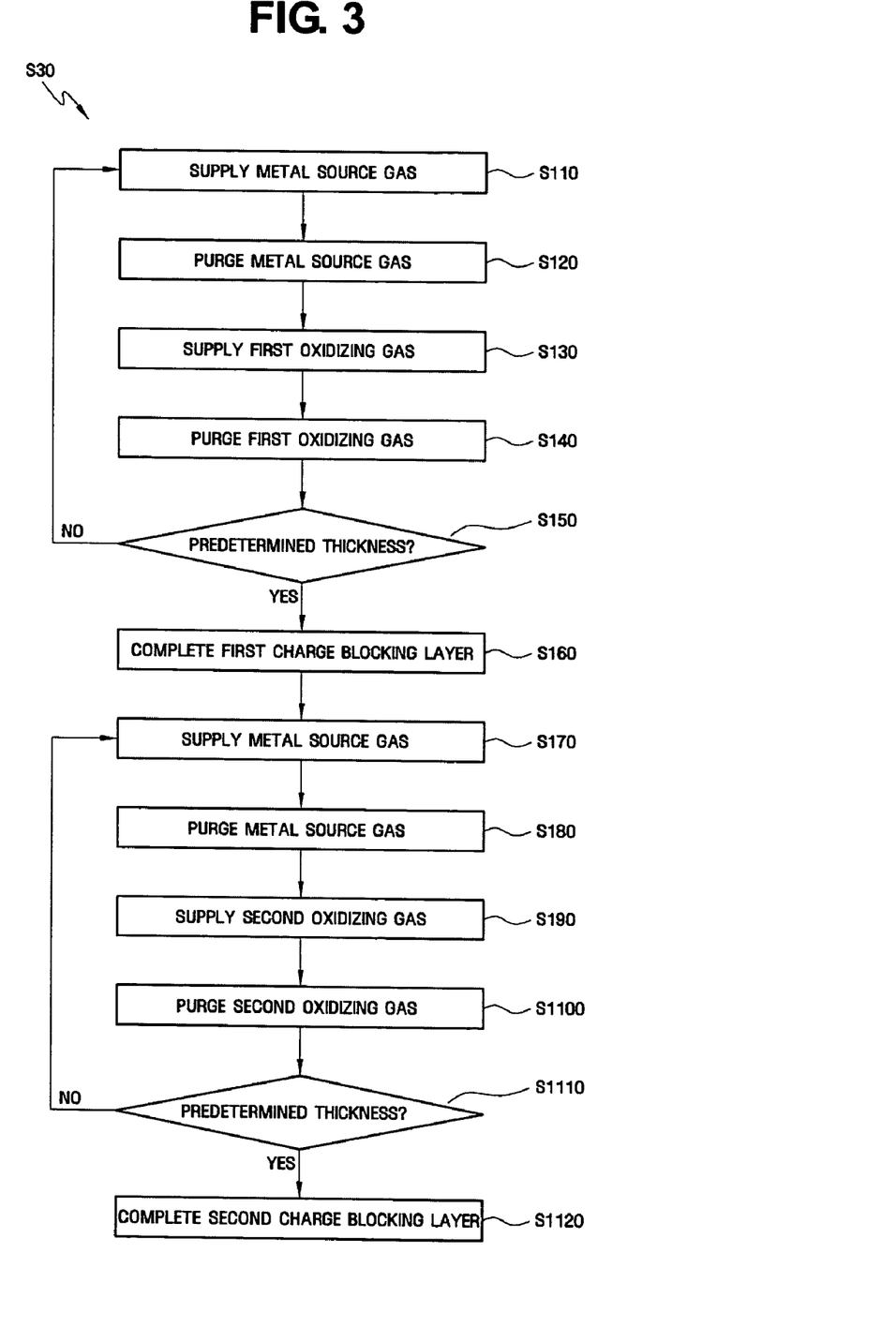
FIG. 3 illustrates a flowchart of a method of forming a charge blocking layer of a nonvolatile memory device according to an embodiment of the present invention.

An exemplary embodiment of a method of fabricating a nonvolatile memory device of the present invention will now be more fully described with respect to FIGS. 1-3.

As illustrated in FIGS. 1-2A, a charge tunneling layer 110 may be formed on a semiconductor substrate 100, i.e., step S10. More specifically, any suitable semiconductor substrate 100 as determined by one of ordinary skill in the art may be obtained, e.g., a silicon substrate, a silicon-on-insulator (SOI) substrate, a germanium substrate, a germanium-on-insulator (GOI) substrate, a silicon-germanium substrate, an epitaxial thin film substrate formed by a selective epitaxial growth (SEG) technique, and so forth. Subsequently, a device isolation film (not shown) may be formed on the semiconductor substrate 100 by a device isolation process, e.g., local oxidation of silicon (LOCOS) process, shallow trench isolation (STI) process, and so forth, in order to define an active region thereon. Next, the charge tunneling layer 110 may be formed on the semiconductor substrate 100 by chemical vapor deposition (CVD) or atomic layer deposition (ALD) to a thickness of from about 20 angstroms to about 70 angstroms. The charge tunneling layer 110 may be formed of silicon oxide ($SiO_2$), silicon-oxynitride (SiON), silicon nitride ($Si_3N_4$), germanium-oxynitride ($Ge_xO_yN_z$), germanium silicon oxide ($Ge_xSi_yO_z$), a high-k dielectric material, or a combination thereof.

In the next step, i.e., step S20, a charge trapping layer 120 may be formed on the charge tunneling layer 110, as illustrated in FIGS. 1 and 2B. More specifically, the charge trapping layer 120 may have a single layer or a multi-layer structure of a nitride-based material, e.g., silicon nitride (SiN); a high-k dielectric material, e.g., aluminum oxide containing nitrogen, zirconium oxide, hafnium, lanthanum oxide, nitrogen oxide, silicon dioxide, and so forth; quantum dots, e.g., nitride dots, silicon dots, crystal nanodots, metal nanodots, and so forth; or a combination thereof. The single or multi-layer structure of the charge trapping layer 120 may be formed by CVD or ALD to a thickness of from about 50 angstroms to about 90 angstroms, such that, for example, the charge trapping layer 120 may include a multi-layer structure having at least one nitride-based layer and at least one high-k dielectric material layer arranged in any order, e.g., nitride-based layer above the high-k dielectric material layer, high-k dielectric material layer above the nitride-based layer, high-k dielectric material layer between two nitride-based layers, and so forth.

Next, as illustrated in FIGS. 1 and 2C, a first charge blocking layer 130 and a second charge blocking layer 140 may be formed on the charge trapping layer 120 in step S30. More specifically, each of the first and second charge blocking layers 130 and 140 may be formed by sequentially depositing a high-k dielectric metal oxide material, e.g., aluminum oxide ($Al_2O_3$), hafnium oxide ($HfO_2$), zirconium oxide ($ZrO_2$), lanthanum oxide ($La_2O_3$), tantalum oxide ($Ta_2O_3$), titanium oxide ($TiO_2$), strontium titanium oxide ($SrTiO_3$), barium strontium titanium oxide (BST), or a combination thereof, by ALD on the charge trapping layer 120. Without intending to be bound by theory, it is believed that the use of a high-k dielectric material for sequentially depositing each of the first and second charge blocking layers 130 and 140 on the charge trapping layer 120 may facilitate formation of a charge blocking layer having a relatively high predetermined total thickness, i.e., a combined thickness of the first and second charge blocking layers 130 and 140. In other words, a combined thickness of the first and second charge blocking layers 130 and 140 may range from about 100 angstroms to about 200 angstroms.

Formation of the first and second charge blocking layers 130 and 140 will be described in more detail with respect to FIG. 3. In particular, the semiconductor substrate 100 having the charge tunneling layer 110 and the charge trapping layer 120 thereon may be placed in a processing chamber (not shown), and a metal source gas may be supplied to initiate interaction between the metal source gas and the charge trapping layer 120, as step S110 of FIG. 3, in order to form the first charge blocking layer 130. For example, formation of the first charge blocking layer 130 of an aluminum oxide layer may include supply of trimethyl-aluminum (TMA: $Al(CH_3)_3$), aluminum chloride ($AlCl_3$), trimethylamine alane ($AlH_3N(CH_3)_3$), trimethyl-aluminum oxetane ($C_6H_{15}AlO$), dibutyl-aluminum hydride (($C_4H_9)_2AlH$), dimethyl-aluminum chloride (($CH_3)_2AlCl$), triethyl-aluminum (($C_2H_5)_3Al$) or tributyl-aluminum (($C_4H_9)_3Al$) as the metal source gas to provide an aluminum precursor, i.e., a source for aluminum atoms, such that aluminum atoms may be deposited onto the charge trapping layer 120.

Next, in step S120, a purge gas may be supplied into the processing chamber in order to remove unreacted gas, e.g., aluminum atoms and/or aluminum precursor gas. The purge gas may be an inert gas such as argon (Ar), helium (He), or nitrogen ($N_2$).

In the next step, i.e., step S130, a first oxidizing gas may be supplied into the processing chamber in order to trigger a reaction between the metal atoms, e.g., aluminum, deposited onto the charge trapping layer 120 and the first oxidizing gas. The first oxidizing gas may have a weak oxidizing power. In other words, the first oxidizing gas may have sufficient oxidizing power to oxidize the metal ions, e.g., aluminum, deposited on the charge trapping layer 120 to form a metal oxide layer, e.g., aluminum oxide, but not sufficient oxidizing power to oxidize the ions of the charge trapping layer 120. For example, the first oxidizing gas may be water vapor ($H_2O$), hydrogen peroxide ($H_2O_2$), nitrogen dioxide ($NO_2$), nitrous oxide ($N_2O$), oxygen ($O_2$), and so forth.

Without intending to be bound by theory, it is believed that employing an oxidizing gas having a weak oxidizing power for formation of the first charge blocking layer 130 may trigger oxidation of the metal source gas deposited on the charge trapping layer 120 but no oxidation of the charge trapping layer 120 due to the weak oxidation power thereof. In other words, employing an oxidizing gas having a weak oxidizing power for formation of the first charge blocking layer 130 may minimize potential oxidation of the charge trapping layer 120.

Next, in step S140, a purge gas may be supplied again into the processing chamber in order to remove unreacted first oxidizing gas and reaction by-products.

Steps S110 through S140 may be repeated, i.e., step S150, until a metal oxide layer, e.g., aluminum oxide ($Al_2O_3$) layer, may have a thickness of about 5 angstroms to about 50 angstroms. Without intending to be bound by theory, it is believed that formation of a metal oxide layer, e.g., aluminum oxide layer, having such thickness, i.e., step S160, may minimize oxidation of the charge trapping layer 120, thereby finalizing completion of the first charge blocking layer 130.

Once the first charge blocking layer 130 is formed, a metal source gas, as illustrated in FIG. 3, may be supplied into the processing chamber to initiate interaction between the metal source gas and the first charge blocking layer 130 in step S170. The metal source gas may be identical to the metal source gas supplied in step S110, e.g., trimethyl-aluminum (TMA: $Al(CH_3)_3$), aluminum chloride ($AlCl_3$), trimethylamine alane ($AlH_3N(CH_3)_3$), trimethyl-aluminum oxetane ($C_6H1_5AlO$), dibutyl-aluminum hydride (($C_4H_9)_2AlH$), dimethyl-aluminum chloride (($CH_3)_2AlCl$), triethyl-aluminum (($C_2H_5)_3Al$), tributyl-aluminum (($C_4H_9)_3Al$), and so forth Next, in step S180, a purge gas may be supplied into the processing chamber in order to remove unreacted gas therefrom. The purge gas may be an inert gas such as argon (Ar), helium (He), or nitrogen ($N_2$).

In the next step, i.e., step S190, a second oxidizing gas may be supplied into the processing chamber in order to trigger a reaction between the metal atoms, e.g., aluminum, deposited onto the first charge blocking layer 130 and the second oxidizing gas to form a second metal oxide layer, i.e., the second charge blocking layer 140. The second oxidizing gas may have an oxidizing power that is higher than the oxidizing power of the first oxidizing gas, thereby providing enhanced metal oxide film quality. In other words, the second oxidizing gas may have sufficient oxidizing power to oxidize the ions of the charge trapping layer 120 when in direct contact for a sufficient length of time. For example, the second oxidizing gas may be ozone ($O_3$).

Without intending to be bound by theory, it is believed that despite the strong oxidation power of the second oxidizing gas, oxidation of the charge trapping layer 120 may be prevented because the first charge blocking layer 130 positioned between the charge trapping layer 120 and the second charge blocking layer 140 may prevent contact therebetween, thereby minimizing potential oxidation of the charge trapping layer 120.

Next, in step S1100, a purge gas may be supplied again into the processing chamber in order to remove unreacted second oxidizing gas and reaction by-products therefrom. The purge gas may be an inert gas such as argon (Ar), helium (He), or nitrogen ($N_2$).

Steps S170 through S1100 may be repeated, i.e., step S1110, until a metal oxide layer, e.g., aluminum oxide ($Al_2O_3$) layer, having a thickness of about 50 angstroms to about 195 angstroms may be deposited on the first charge blocking layer 130 to form the second charge blocking layer 140, thereby completing formation of the first and second charge blocking layers 130 and 140.

Once the first and second charge blocking layers 130 and 140 are formed, a gate electrode layer 150 may be deposited thereon, as further illustrated in step S40 of FIG. 1. More specifically, the gate electrode layer 150 may be formed by depositing a conductive material, such as doped polysilicon; a metallic material, e.g., tungsten (W), platinum (Pt), ruthenium (Ru), iridium (Ir), tin nitride (TiN), tantalum nitride (TaN), tungsten nitride (WN), ruthenium oxide ($RuO_2$), iridium oxide ($IrO_2$), or a combination thereof, to a thickness of from about 150 angstroms to about 300 angstroms.

Next, as illustrated in FIGS. 1 and 2E, the charge tunneling layer 110, the charge trapping layer 120, the first charge blocking layer 130, the second charge blocking layer 140, and the gate electrode layer 150 may be patterned to form a gate structure 160 having a charge tunneling film 112, a charge trapping film 122, a first charge blocking film 132, a second charge blocking film 134, and a gate electrode film 152 in step S50, such that peripheral portions of an upper surface of the semiconductor substrate 100 may be exposed. Impurities may be injected into the peripheral portions, i.e., into one peripheral portion on each side of the gate structure 160, of the semiconductor substrate 100 to form source/drain regions 162 and 164, respectively, thereby completing formation of the nonvolatile memory device 10 according to an embodiment of the present invention.

Without intending to be bound by theory, it is believed that the nonvolatile memory device 10 fabricated according to an embodiment of the present invention may be advantageous because formation of two charge blocking layers by employing oxidizing gases having different oxidation powers, while the charge blocking layer formed directly on the charge trapping layer may be formed with a weak oxidizing gas, may minimize oxidation of the charge trapping layer 120. Accordingly, threshold voltage window characteristics of the nonvolatile memory device 10, as will be discussed in more detail below, may be enhanced.

In another aspect of the present invention, operation of the nonvolatile memory device 10 fabricated according to the exemplary embodiment of the present invention illustrated with respect to FIGS. 1-3 will be discussed in more detail below.

In order to perform memory programming, e.g., a channel hot electron injection (CHEI) method, a high voltage, e.g., voltage of from about 5 V to about 8 V, may be applied to the gate electrode 160. Next, a high voltage, e.g., voltage of from about 5 V to about 8 V may be applied to the drain region 164, while the source region 162 may be grounded. Consequently, a potential difference may be created between the source region 162 and the drain region 164, thereby generating a lateral electric field that may form a channel.

Formation of a channel may trigger electron movement from the source region 162 to the drain region 164 therethrough, thereby facilitating energy gain by the electrons. Sufficient energy gain by the electrons may pass the electrons through an energy barrier of the charge tunneling layer 110 in order to tunnel through the charge tunneling layer 110 and to reach the charge trapping layer 120. Trapping of the electrons in the charge trapping layer 120 may increase a threshold voltage $V_{th}$ of the nonvolatile memory device 10.

In order to perform memory erasing, a negative voltage, e.g., voltage of from about (−16) V to about (−12) V, may be applied to the gate electrode 160. Additionally, a positive voltage, e.g., voltage of from about 4 V to about 7 V may be applied to the drain region 164, while the source region 162 may be grounded. Consequently, a depletion region may be formed near the drain region 164, thereby triggering holes generation therein. The generated holes may be accelerated by an electric field, thereby changing into hot holes. The hot holes may be injected into the charge trapping layer 120 to be combined with the electrons trapped in the charge trapping layer 120, thereby lowering the threshold voltage $V_{th}$ of the nonvolatile memory device 10.

Alternatively, the memory erasing may be performed by a Fowler-Nordheim (FN) tunneling method. In other words, a negative voltage, e.g., voltage of from about (−16) V to about (−12) V, may be applied to the gate electrode 160, and a positive voltage, e.g., voltage of from about 4 V to about 7 V, may be applied to each of the drain region 164 the source region 162. Consequently, holes may be injected into the charge trapping layer 120 to be combined with the electrons trapped in the charge trapping layer 120, thereby lowering the threshold voltage $V_{th}$ of the nonvolatile memory device 10.

In order to perform memory reading operation, a positive voltage, e.g., voltage of about 3 V, may be applied to the gate electrode 160, and a voltage of from about 0.8 V to about 2 V, i.e., voltage that is lower than the positive voltage applied to the gate electrode 160, may be applied to the source region 162. The drain region 164 may be grounded or a voltage lower than the voltage applied to the source region 162 may be applied thereto. Such voltage application with respect to programming and erasing operations may vary the threshold voltage $V_{th}$ of the nonvolatile memory device 10 and the respective current flow. Accordingly, stored information in the memory device 10 may be identified with respect to changes in the current flow.

The difference between a threshold voltage of a nonvolatile memory device when programmed and a threshold voltage of a nonvolatile memory device when erased may be referred to as the threshold voltage window. Accordingly, as the threshold voltage window increases, a memory storage capacity may increase as well. In other words, since the threshold voltage window of the nonvolatile memory device 10 fabricated according to an embodiment of the present invention may be increased due to minimized oxidation between the charge trapping layer 120 and the first and second charge blocking layers 130 and 140, the overall memory capacity of the nonvolatile memory device 10 may be enhanced.

EXAMPLES

In the following experimental examples a conventional nonvolatile memory device and a nonvolatile memory device according to the present invention were prepared and compared with respect to their operation. The memory devices were formed as follows. A charge tunneling layer of a silicon oxide film ($SiO_2$), a charge trapping layer of a silicon nitride film (SiN), a first and second charge blocking layers of aluminum oxide ($Al_2O_3$), and a gate electrode layer of a tantalum nitride film (TaN) were sequentially applied to a semiconductor substrate.

In particular, the charge blocking layer of the conventional nonvolatile memory device was formed with ozone ($O_3$) to have a single-layer structure with a thickness of 200 angstroms. On the other hand, the nonvolatile memory device according to the present invention was formed with $H_2O$ and $O_3$ oxidizing gases to have a first charge blocking layer with a thickness of 25 angstroms and a second charge blocking layer with a thickness of 175 angstroms, respectively. The aluminum source gas employed was TMA.

Experimental Example 1

Once the two nonvolatile memory devices were complete, changes in the threshold voltage windows ($V_{th\ window}$) of each nonvolatile memory device were observed.

Figure 4:
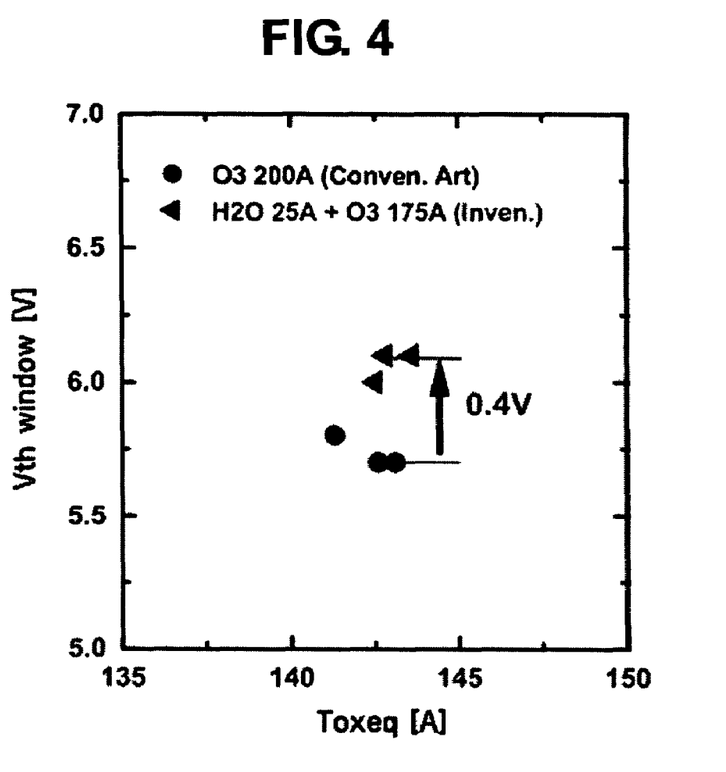
FIG. 4 illustrates a graph comparing threshold voltage window characteristics of a conventional nonvolatile memory device and a nonvolatile memory device according to an embodiment of the present invention.

As illustrated in FIG. 4, the threshold voltage window ($V_{th\ window}$) of the nonvolatile memory device according to an embodiment of the present invention was approximately 0.4 V higher than that of the conventional nonvolatile memory device. Accordingly, the nonvolatile memory device fabricated according to the embodiment of the present invention has superior threshold voltage window characteristics as compared to the conventional nonvolatile memory device, thereby exhibiting improved memory capacity.

Experimental Example 2

Figure 5A:
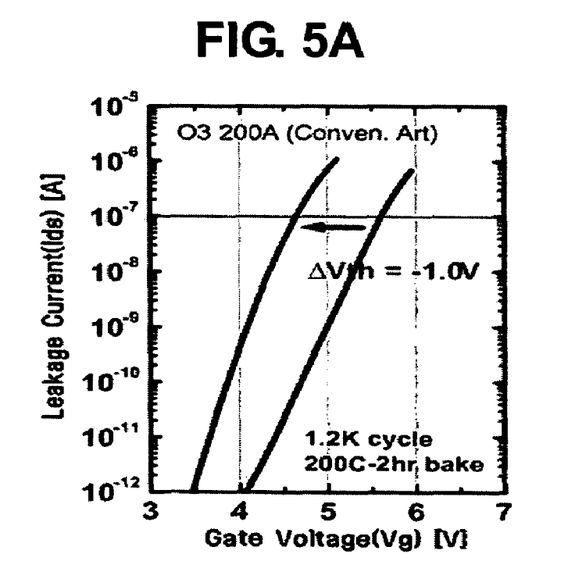
FIGS. 5A and 5B illustrate graphs of reliability evaluation results of a conventional nonvolatile memory device and a nonvolatile memory device according to an embodiment of the present invention, respectively.
Figure 5B:
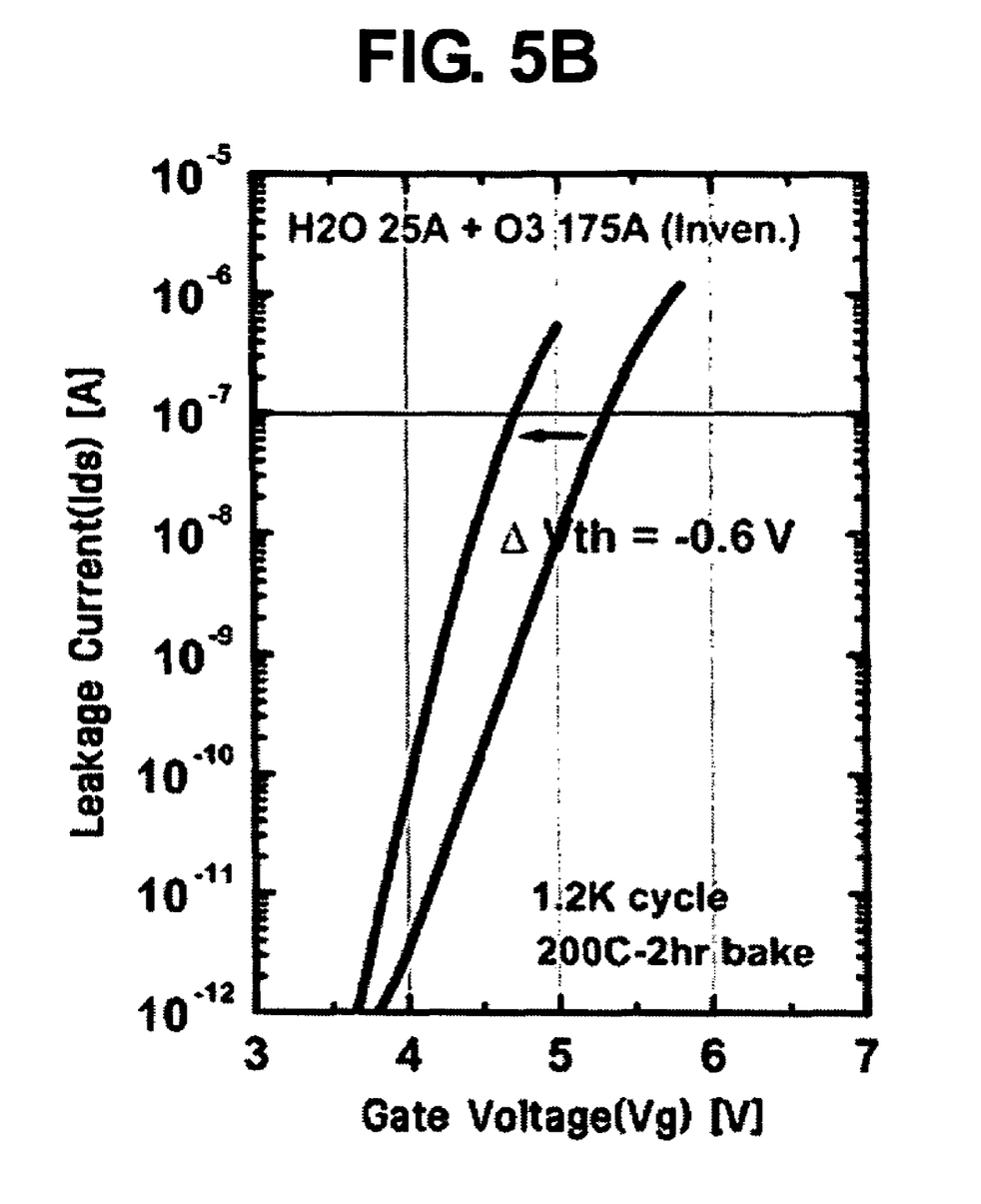

Drain current with respect to a gate voltage of each nonvolatile memory device was plotted in FIGS. 5A and 5B, respectively, to illustrate reliability evaluation results of each nonvolatile memory device.

More specifically, a programming and erasing cycle was performed 1200 times on each of the nonvolatile memory devices followed by baking for two hours at a temperature of 200° C. Then, changes in the threshold voltages of the nonvolatile memory devices were compared.

As illustrated in FIGS. 5A-5B, when the drain current is 10E-7A, the threshold voltage window ($V_{th\ window}$) of the nonvolatile memory device of FIG. 5A, i.e., conventional nonvolatile memory device, was reduced by approximately 1.0 V while the threshold voltage window ($V_{th\ window}$) of the nonvolatile memory device of FIG. 5B, i.e., nonvolatile memory device according to the present invention, was reduced by approximately 0.6 V. In other words, the threshold voltage window ($V_{th\ window}$) of the nonvolatile memory device according to the present invention has smaller voltage reduction as compared to the conventional nonvolatile memory device after 1200 programming/erasing cycles and baking. Accordingly, the range of data storage in the nonvolatile memory device according to an embodiment of the present invention may be increased, thereby enhancing its reliability.

As described above, according to a method of fabricating a nonvolatile memory device of the present invention, sequential formation of first and second charge blocking layers with oxidizing gases having different oxidizing powers may minimize oxidation of the charge trapping layer, thereby enhancing the threshold voltage window characteristics of the nonvolatile memory device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a nonvolatile memory device, comprising:
    forming a charge tunneling layer on a semiconductor substrate;
    forming a charge trapping layer on the charge tunneling layer;
    forming a first charge blocking layer on the charge trapping layer by supplying a metal source gas and a first oxidizing gas onto the charge trapping layer;
    forming a second charge blocking layer on the first charge blocking layer by supplying a metal source gas and a second oxidizing gas onto the first charge blocking layer, wherein the second oxidizing gas has a higher oxidizing power as compared to the first oxidizing gas; and
    forming a gate electrode layer on the second charge blocking layer;
    wherein an unreacted gas is purged after every supplying of the metal source gas, the first oxidizing gas, or the second oxidizing gas.

2. The method as claimed in claim 1, wherein supplying the first oxidizing gas includes supplying any one of water vapor ($H_2O$), hydrogen peroxide ($H_2O_2$), nitrogen dioxide ($NO_2$), nitrous oxide ($N_2O$), or oxygen ($O_2$).

3. The method as claimed in claim 1, wherein supplying the second oxidizing gas includes supplying ozone ($O_3$).

4. The method as claimed in claim 1, wherein forming the first charge blocking layer and forming the second charge blocking layer include repeating the supplying of the metal source gas and the first and second oxidizing gas, respectively, until a predetermined total thickness of the first and second charge blocking layers is formed.

5. The method as claimed in claim 4, wherein repeating the supplying of the metal source gas and the first and second oxidizing gases includes depositing the first and second charge blocking layers to have a predetermined total thickness of from about 100 angstroms to about 200 angstroms.

6. The method as claimed in claim 5, wherein repeating the supplying of the metal source gas and the first and second oxidizing gases includes forming the first charge blocking layer to have a lower thickness than the second charge blocking layer.

7. The method as claimed in claim 6, wherein forming the first charge blocking layer includes forming a layer having a thickness of from about 5 angstroms to about 50 angstroms.

8. The method as claimed in claim 6, wherein forming the second charge blocking layer includes forming a layer having a thickness of from about 50 angstroms to about 195 angstroms.

9. The method as claimed in claim 1, wherein supplying the metal source gas includes supplying an aluminum source gas.

10. The method as claimed in claim 9, wherein supplying the aluminum source gas includes supplying any one of tri-methyl-aluminum (TMA: $Al(CH_3)_3$), aluminum chloride ($AlCl_3$), trimethylamine alane ($AlH_3N(CH_3)_3$), trimethyl-aluminum oxetane ($C_6H{15}AlO$), dibutyl-aluminum hydride ($(C_4H_9)_2AlH$), dimethyl-aluminum chloride ($(CH_3)_2AlCl$), triethyl-aluminum ($(C_2H_5)_3Al$) or tributyl-aluminum ($(C_4H_9)_3Al$).

11. The method as claimed in claim 1, wherein forming the charge tunneling layer includes depositing silicon oxide ($SiO_2$), silicon-oxynitride (SiON), silicon nitride ($Si_3N_4$), germanium-oxynitride ($Ge_xO_yN_z$), germanium silicon oxide ($Ge_xSi_yO_z$), a high-k dielectric material, or a combination thereof on the semiconductor substrate.

12. The method as claimed in claim 1, wherein forming the charge trapping layer includes depositing silicon-oxynitride (SiON), silicon nitride ($Si_3N_4$), or metal oxynitride on the charge tunneling layer.

13. The method as claimed in claim 1, wherein forming each of the first and second charge blocking layers includes depositing a layer of aluminum oxide ($Al_2O_3$), hafnium oxide ($HfO_2$), zirconium oxide ($ZrO_2$), lanthanum oxide ($La_2O_3$), tantalum oxide ($Ta_2O_3$), titanium oxide ($TiO_2$), strontium titanium oxide ($SrTiO_3$), barium strontium titanium oxide (BST), or a combination thereof.

14. The method as claimed in claim 1, wherein forming the first and second charge blocking layers includes use of identical materials.

15. The method as claimed in claim 1, wherein forming the gate electrode layer includes depositing polysilicon, a metallic material, metal nitride, conducive metal oxide, or a combination thereof onto the charge blocking layer.

16. The method as claimed in claim 1, wherein purging the unreacted gas includes supplying an inert gas.

* * * * *